United States Patent
Ando et al.

(10) Patent No.: US 8,836,037 B2
(45) Date of Patent: Sep. 16, 2014

(54) STRUCTURE AND METHOD TO FORM INPUT/OUTPUT DEVICES

(75) Inventors: Takashi Ando, Tuckahoe, NY (US); Min Dai, Mahwah, NJ (US); Martin M. Frank, Dobbs Ferry, NY (US); Barry P. Linder, Hastings-on-Hudson, NY (US); Shahab Siddiqui, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/584,156

(22) Filed: Aug. 13, 2012

(65) Prior Publication Data

US 2014/0042546 A1 Feb. 13, 2014

(51) Int. Cl.
*H01L 29/78* (2006.01)
*H01L 21/314* (2006.01)
*H01L 27/088* (2006.01)

(52) U.S. Cl.
USPC ............ 257/368; 257/E29.255; 257/E21.267; 438/763

(58) Field of Classification Search
None
See application file for complete search history.

(56) References Cited

U.S. PATENT DOCUMENTS

| | | | |
|---|---|---|---|
| 5,904,575 A * | 5/1999 | Ishida et al. ................. | 438/770 |
| 7,871,942 B2 | 1/2011 | Kher et al. | |
| 7,879,739 B2 | 2/2011 | Rachmady et al. | |
| 7,910,419 B2 | 3/2011 | Fenouillet-Beranger et al. | |
| 8,168,811 B2 | 5/2012 | Cameron et al. | |
| 2004/0082125 A1 * | 4/2004 | Hou et al. ..................... | 438/240 |
| 2004/0144980 A1 * | 7/2004 | Ahn et al. ..................... | 257/69 |
| 2008/0286589 A1 * | 11/2008 | Shero et al. .................. | 428/472 |
| 2008/0293259 A1 * | 11/2008 | Andreoni et al. ............ | 438/795 |
| 2009/0023280 A1 * | 1/2009 | Ang et al. .................... | 438/594 |
| 2010/0044806 A1 * | 2/2010 | Hou et al. ..................... | 257/412 |
| 2010/0072539 A1 * | 3/2010 | Yasuda ......................... | 257/326 |
| 2010/0320547 A1 * | 12/2010 | Ando et al. ................... | 257/411 |
| 2012/0074533 A1 * | 3/2012 | Aoyama et al. ............. | 257/632 |
| 2012/0094477 A1 * | 4/2012 | Forbes et al. ................ | 438/591 |
| 2012/0094504 A1 * | 4/2012 | Yao et al. ..................... | 438/763 |
| 2012/0104381 A1 | 5/2012 | Shieh et al. | |
| 2012/0261773 A1 * | 10/2012 | Ogawa ......................... | 257/412 |
| 2012/0280288 A1 * | 11/2012 | Ando et al. ................... | 257/288 |

OTHER PUBLICATIONS

Ishikawa, Dai, Satoshi Kamiyama, Etsuo Kurosawa, Takayuki Aoyama, and Yasuo Nara. "Extended Scalability of HfON/SiON Gate Stack Down to 0.57 Nm Equivalent Oxide Thickness with High Carrier Mobility by Post-Deposition Annealing." Japanese Journal of Applied Physics 48.No. 4 (2009): 04C004.*

(Continued)

*Primary Examiner* — Thomas L Dickey
*Assistant Examiner* — Joseph Schoenholtz
(74) *Attorney, Agent, or Firm* — Whitham, Curtis, Christofferson & Cook, P.C.; Joseph P. Abate

(57) ABSTRACT

A limited number of cycles of atomic layer deposition (ALD) of Hi-K material followed by deposition of an interlayer dielectric and application of further Hi-K material and optional but preferred annealing provides increased Hi-K material content and increased breakdown voltage for input/output (I/O) transistors compared with logic transistors formed on the same chip or wafer while providing scalability of the inversion layer of the I/O and logic transistors without significantly compromising performance or bias temperature instability (BTI) parameters.

20 Claims, 4 Drawing Sheets

(56) References Cited

OTHER PUBLICATIONS

Choi, K.; Jagannathan, H.; Choi, C.; Edge, L.; Ando, T.; Frank, M.; Jamison, P.; Wang, M.; Cartier, E.; Zafar, S.; Bruley, J.; Kerber, A.; Linder, B.; Callegari, A.; Yang, Q.; Brown, S.; Stathis, J.; Lacoponi, J.; Paruchuri, V., Narayanan, V., Extremely scaled gate-first high-k/metal gate stack with EOT of 0.55 nm using novel interfacial layer sca.*

Kelim Kuhn, "22 nm Device Architecture and Performance Elements, IEDM 2008", downloaded from URL<download.intel.com/pressroom/pdf/kkuhn/Kuhn_22nm_Device.pdf > on Apr. 25, 2013.*

Joshi, K., et. al. "Scaled Gate Stacks for Sub-20-nm CMOS Logic Applications Through Integration of Thermal IL and ALD HfOx", Electron Device Letters, IEEE, on pp. 3-5 vol. 34, Issue: 1, Jan. 2013.*

Witters, L, et. al.., "8ÅTinv gate-first dual channel technology achieving low-Vt high performance CMOS,"VLSI Technology (VLSIT), 2010 Symposium on , vol., No., pp. 181,182, Jun. 15-17, 2010.*

Rusty Harris, et. al., "Band-Engineered Low PMOS VT with High-K/Metal Gates Featured in a Dual Channel CMOS Integration Scheme," VLSI Technology, 2007 IEEE Symposium on , vol., No., pp. 154,155, Jun. 12-14, 2007.*

Ando, T., Understanding Mobility Mechanisms in Extremely Scaled HfO2 (EOT 0.42 nm) Using Remove Interfacial Layer Scavenging Technique and Vt—tuning Dipoles with Gate-First Process, IEDM 2009, p. 423-6.*

Consiglio, S., et. al. Crystallinity of Electrically Scaled Atomic Layer Deposited HfO2 from a Cyclical Deposition and Annealing Scheme, J. of Electrochemical Society 159(6) G80-88 (2012).*

Ioannou, D.P.; Cartier, E.; Wang, Y.; Mittl, S., "PBTI response to interfacial layer thickness variation in Hf-based HKMG nFETs," Reliability Physics Symposium (IRPS), 2010 IEEE International , vol., No., pp. 1044,1048, May 2-6, 2010.*

Kalra, Pankaj. Advanced Source/Drain Technologies for Nanoscale CMOS. Diss. University of California, 2003. Berkeley: University of California, 2003.*

N. Niwa et. al. "Current Status of PVD Hf-based high -k gate stack—process improvement on drive current" downloaded fro URL<http://www.rcns.hiroshima-u.ac.jp/21coe/pdf/4th_WS/plenary-p24.pdf> on Aug. 2, 2013.*

Kim, Won-Kyu. "Atomic Layer Chemical Vapor Deposition (ALCVD) of Hf and Zr Silicate and Aluminate High-k Gate Dielectric for Next Generation Nano Devices." Journal of Chemical Engineering of Japan 38.8 (2005): 578-87.*

Tanimura, T., et. al. "Relationship between band alignment and chemical states upon annealing in HfSiON/SiON stacked films on Si substrates", Appl. Phys. Lett. 95, 183113 (2009).*

Toyoda, S., H. Kamada, A. Kikuchi, H. Kumigashira, M. Oshima, K. Iwamoto, T. Sukegawa, and Z. Liu. "Effect of Nitrogen Bonding States on Dipole at the HfSiO/SiON Interface Studied by Photoemission Spectroscopy." Journal of Applied Physics 107.12 (2010): 124103.*

Py M., et. al. "Quantitative depth profiling of ultrathin high-k stacks with full spectrum time of flight-secondary ion mass spectrometry" J. Vac. Sci. Technol. B 29 032208 (2011).*

Ando, Takashi. "Ultimate Scaling of High-κGate Dielectrics: Higher-κor Interfacial Layer Scavenging?" Materials 5 (2012): 478-500.*

Ando, T.; Frank, et. al., Understanding mobility mechanisms in extremely scaled HfO2 (EOT 0.42 nm) using remote interfacial layer scavenging technique and Vt-tuning dipoles with gate-first process. In Proceedings of IEEE International Electron Devices Meeting, Washington, DC, USA, Dec. 7-9, 2009; pp. 423-426.*

Kerber, Andreas Metal Gate / High-k Reliability Characterization: From Research to Development and Manufacturing, Sematech AGST Symposium 2010.*

Sensaki, Y, et. al. "Atomic Layer Deposition of High-k Dielectric and Metal Gate Stacks for MOS Devices", International Conference on Characterization and Metrology for ULSI Technology, Mar. 15-18, 2005.*

Kelwing, T., et. al. Hafnium-based gate dielectrics for high performance logic CMOS applications', Semicon-Eurpoa, Dresden, Oct 2001.*

Hiller, D., et. al. "Low temperature silicon dioxide thermal atomic layer deposition" Investigation of material properties:, J. of Applied Physics, 107, 064314 (2010).*

Hausmann, D., et. al. Atomic Layer Deposition of Hafnium and Zirconium Oxides using Metal Amide Precursors:, Chem. Matter, 14, 2002, pp. 4350-4358.*

Ishikawa, D, et. al., "Extended Scalability of HfON/SiON Gate Stack Down to 0.57 nm Equivalent Oxide Thickenss with High Carrier Mobility by Post-Deposition Annealing", Japanes Journal of Applied Physics, 48 (2009), 04C004-5.*

Johnson, D.D., "Chapter 6 Diffusion in Solids", Material Science Engineering 280, University of Illinois, 2008.*

Zhao, C, Zhao, C.Z., Werner M., Taylor, S., and Chalker, P.R., "Advanced CMOS Gate Stack: Present Research Progress," ISRN Nanotechnology, vol. 2012, Article ID 689023, 35 pages, 2012.*

Kaczer, V. Arkhipov, M. Jurczak, G. Groeseneken, Negative bias temperature instability (NBTI) in SiO2 and SiON gate dielectrics understood through disorder-controlled kinetics, Microelectronic Engineering, vol. 80, Jun. 17, 2005, pp. 122-125.*

Niwa, Masaaki, "Development of 32nm CMOS and Recent Trend for Beyond 32 nm", 7th Annual Semateach Symposium Japan, Jun. 2011, Tokyo Japan.*

Hu, C.M., "Chapter 5, MOS Capacitor", University of California, EECS Feb. 13, 2009, Downloaded from URL <http://www.eecs.berkeley.edu/~hu/Chenming-Hu_ch5.pdf> on Aug. 3, 2013.*

Definition of content, from Merriam Webster's downloaded from URL http://www.merriam-webster.com/dictionary/content> on Aug. 6, 2013,.*

Takeuchi, H, et. al., "Process Optimization and Integration of HfO2 and Hf-silicates", Mat. Res. Soc. Symp. Proc. vol. 811 (2004) pp. D7.6.1-D7.6.12.*

Rusty Harris, et. al., "Band-Engineered Low PMOS VT with High-K/Metal Gates Featured in a Dual Channel CMOS Integration Scheme," 2007 IEEE Symposium on VLSI Technology, pp. 154,155, Jun. 12-14, 2007.*

Senzaki, Y. et. al.,"Atomic Layer Deposition of High-k Dielectric and Metal Gate Stacks for MOS Devices", International Conference on Characterization and Metrology for ULSI Technology Mar. 15-18, 2005.*

Karavaev, K., "In-situ Atomic Layer Deposition Growth of Hf-oxide", Diss. Brandenburg University of Technology, 2010. Cottbus: Faculty for Mathematics, 2010.*

Hiller, D., et. al. "Low temperature silicon dioxide thermal atomic layer deposition Investigation of material properties", J. of Applied Physics, 107, 064314 (2010).*

Jan, C-H., et. al. "A 45nm low power system-on-chip technology with dual gate (logic and I/O) high-k/metal gate strained silicon transistors," Electron Devices Meeting, 2008. IEDM 2008. IEEE International , vol., No., pp. 1,4, Dec. 15-17, 2008.*

Senzaki, Y., et. al. "Atomic layer deposition of hafnium oxide and hafnium silicate thin films using liquid and ozone" J. Vac. Sci. Technol. A 22(4), Jul./Aug. 2004.*

Niwa, Masaaki, "Development of 32nm CMOS and Recent Trend for Beyond 32 nm", 7th Annual Sematech Symposium Japan, Jun. 2011, Tokyo Japan.*

Doolittle, A. "MOSFET Basics (Understanding with no math)" Course notes from ECE 3040 Georgia Tech downloaded from URL <http://users.ece.gatech.edu/~alan/ECE3040/Lectures/Lecture24-MOS%20Transistors.pdf> on Dec. 17, 2013.*

Gusev, E.P., et al. "Advanced high-k dielectric stacks with polSi and metal gates: Recent Progress and Current Challenges", IBM J. Res. and Dev. vol. 50, No. 4/5 (2006) pp. 387-410.*

Narayanan V., "High-k/Metal Gates—From Research to Reality, International Workshop on Physics of Semiconductor Devices" Mumbai 2007 pp. 42-45.*

* cited by examiner

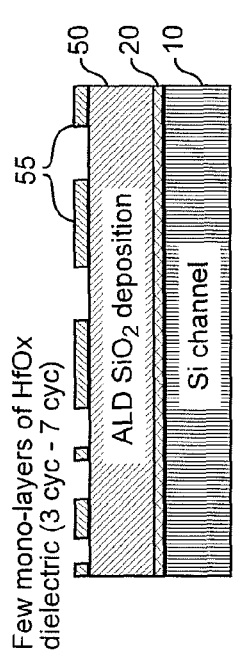
Figure 1
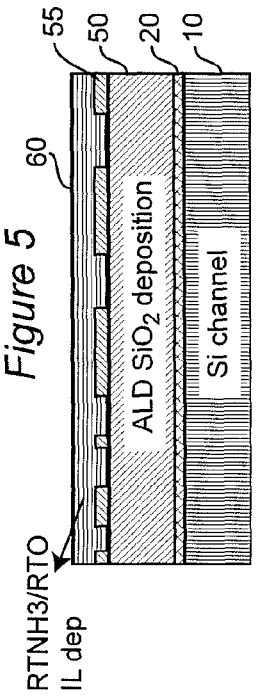
Figure 2
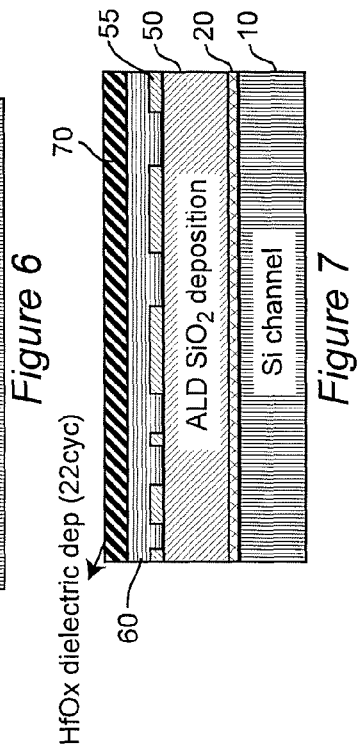
Figure 3
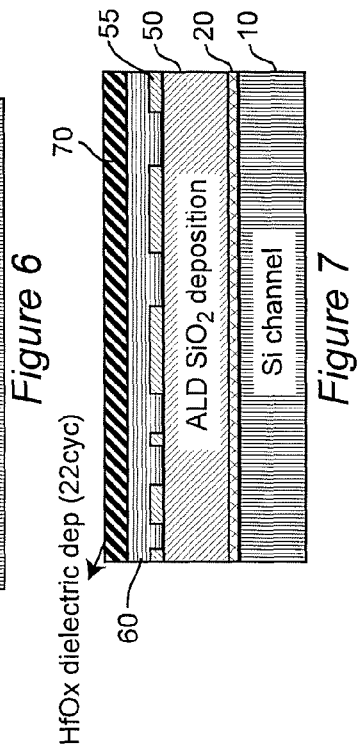
Figure 4
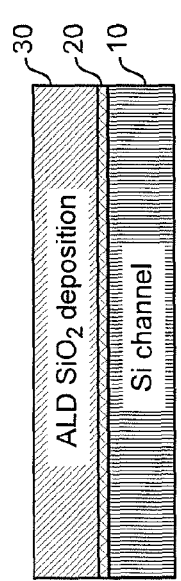
Figure 5
Figure 6
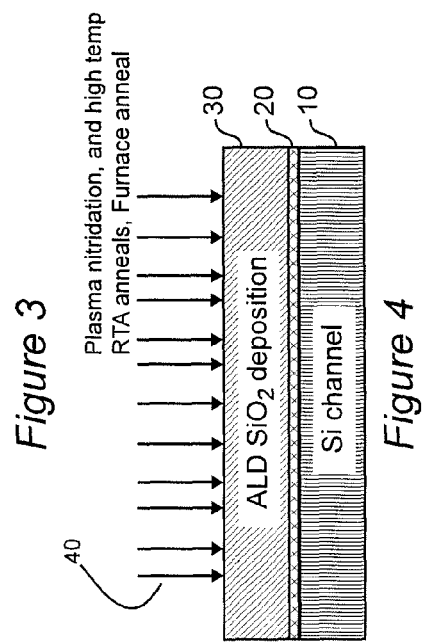
Figure 7

STRUCTURE AND METHOD TO FORM INPUT/OUTPUT DEVICES

FIELD OF THE INVENTION

The present invention generally relates to integrated circuits formed at extremely high integration densities and, more particularly, to the formation of input/output (I/O) transistors integrated with such high integration density devices.

BACKGROUND OF THE INVENTION

It has long been recognized that numerous benefits may be derived by fabrication of semiconductor integrated circuits at very high integration density in which electronic elements such as transistors are formed with features that are of the minimum lithographically feasible dimensions. For example, close proximity of individual integrated circuit elements reduces signal propagation time (allowing higher clock speeds) and susceptibility to noise while allowing maximum functionality to be developed on a single semiconductor chip of practical dimensions at minimum cost, since the cost of required processes is not affected by the number of circuit elements concurrently formed.

However, as circuit elements such as transistors are reduced in size, a given design of, for example, a transistor or various functional portions thereof, such as a gate or gate insulator, may or may not be scalable (e.g. proportionally reduced or increased in size from a design of a similar device using a smaller or larger minimum feature size regime. In general, scaling of a transistor to a different size (and operation at a different nominal voltage which requires or is required by such scaling) will often affect such electrical parameters as switching threshold, breakdown voltage and leakage.

For that reason and some other practical considerations such as increased heat generation from increased numbers of transistors switching at increased clock rates, logic circuitry and memory structures of integrated circuits formed at extremely high densities are generally operated at much reduced voltages, often only a fraction of a volt, while currents are reduced by the reduced gate and connection capacitances achieved by such scaling and integration density. However, input signals to the integrated circuit and output signals developed in response thereto by the integrated circuit must be interfaced to external circuits and cannot be reliably operated at voltages and currents used by the logic circuitry and memory cells of the integrated circuit in order to achieve, for example, adequate noise immunity and to drive the capacitance and resistance of interconnection circuitry. Accordingly, transistors used for such input and/or output (I/O) connections that are capable of operating at higher voltages and currents but which must remain compatible with the transistors of the logic and memory of the integrated circuit (e.g. having switching thresholds scaled to approximately the same proportions of the nominal voltage swing) must also be formed on the chip. Such I/O transistors are generally of increased size and must have an increased breakdown voltage compared with the remainder of the transistors on the chip and yet, for economy of manufacture, are desirably formed using the same processes as the remainder of the transistors on the chip to the greatest extent possible. The I/O transistors must also meet stringent requirements for low leakage without affecting carrier mobility and so-called bias temperature instability (BTI) parameters. Conversely, it is desirable that the logic and memory transistors of the integrated circuit be electrically scalable from the I/O transistor design without increasing leakage or excessive reduction in breakdown voltage.

Unfortunately, such requirements are very difficult to achieve for different minimum feature size regimes. For example, use of a dual layer dielectric of a mixture of silicon oxide and silicon nitride (SiON) can be used to achieve a high breakdown voltage in I/O transistors but scaling of the inversion layer (a thin layer at the surface of the conduction channel adjacent the gate structure which is critical to high performance such as on/off resistance ratio, switching threshold, and switching speed/slew rate) is very difficult without compromising leakage and breakdown voltage.

SUMMARY OF THE INVENTION

It is therefore an object of the present invention to provide a structure for the gate insulator of field effect transistors in which the breakdown voltage and leakage, can be independently controlled at the will of the designer with minimal effect on carrier mobility and BTI parameters and only a slight and non-critical trade-off between scaling of the inversion layer and stability of electrical characteristics while maximizing commonality of gate dielectric formation processes between I/O transistors and transistors of logic circuitry and memory devices.

It is another object of the invention to provide full flexibility of design of electrical characteristics of transistors scaled to different size regimes on the same semiconductor chip over a continuum of breakdown voltages, leakage, and inversion layer dimensions with minimal effects on carrier mobility and BTI parameters.

In order to accomplish these and other objects of the invention, a field effect transistor or integrated circuit is provided including a gate dielectric stack interposed between a gate electrode and a semiconductor conduction channel, said gate dielectric stack comprising a layer of oxynitride material, and a composite layer of interlayer material and Hi-K material.

In accordance with another aspect of the invention, a method of manufacture of a transistor or an integrated circuit comprising logic transistors and I/O transistors is provided comprising steps of forming an oxynitride layer at a transistor location, depositing Hi-K material at a transistor location, forming an interlayer dielectric layer, and depositing a layer of Hi-K material on said interlayer dielectric layer.

BRIEF DESCRIPTION OF THE DRAWINGS

The foregoing and other objects, aspects and advantages will be better understood from the following detailed description of a preferred embodiment of the invention with reference to the drawings, in which:

FIGS. 1, 2, 3, 4, 5, 6, 7, and 8A are a sequence of cross-sectional views illustrating manufacture of the invention.

DETAILED DESCRIPTION OF A PREFERRED EMBODIMENT OF THE INVENTION

Figure 8A:
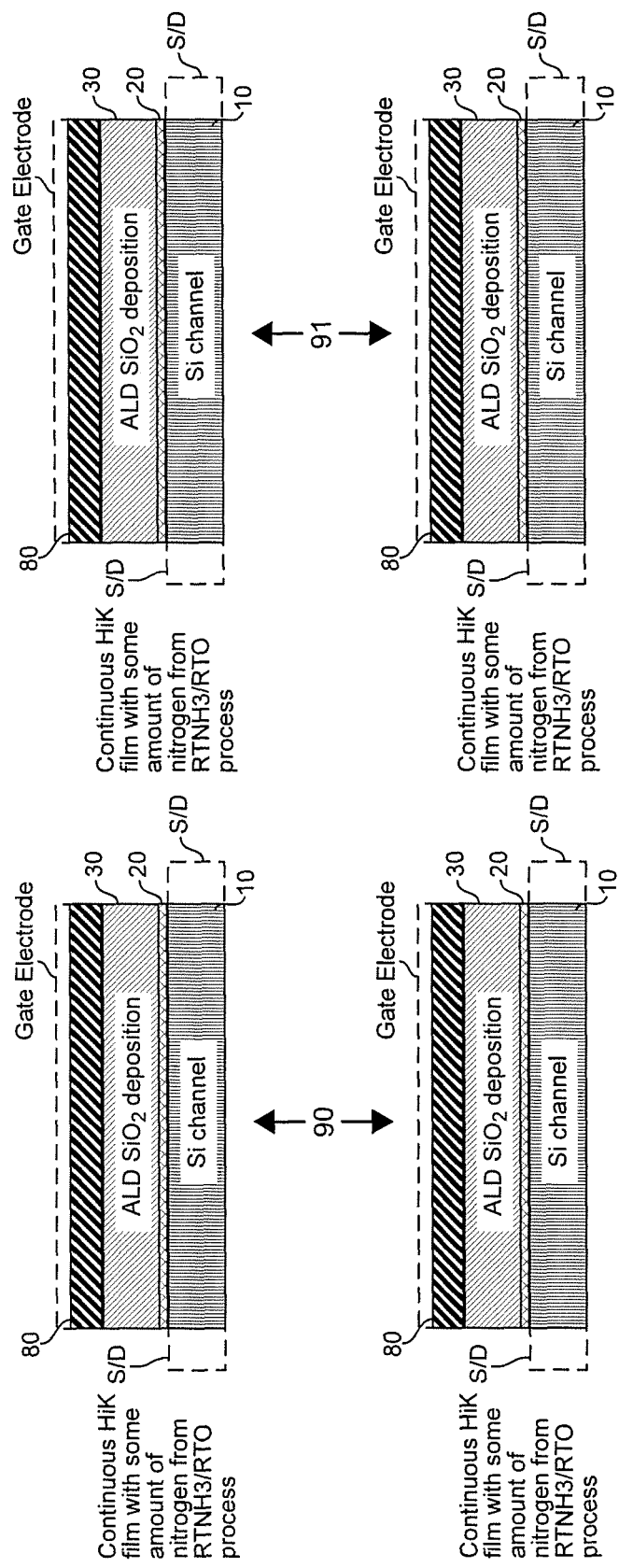

Referring now to the drawings, and more particularly to FIGS. 1-8A, there is shown a sequence of cross-sectional views of a semiconductor structure illustrating manufacture of an I/O transistor gate structure in accordance with the invention while allowing substantial flexibility of design of logic transistors that are compatible therewith and maximizing the number of processes common to formation of both the logic and I/O transistors on the same chip or wafer. As alluded to above, integrated circuits of current and foreseeable designs provide the highest lithographically feasible levels of integration density for the majority of transistors included therein. These transistors will be predominantly used in logic circuits and memory devices where highest clock rates are highly desirable for highest performance which is achieved through extreme density of formation of such devices so that the interconnection wiring lengths and associated signal propagation times can be minimized. Due to thermal effects and other considerations, such transistors formed at extremely high density are operated at reduced voltages such that the breakdown voltages these transistors must withstand is also quite low; allowing the gate dielectrics to be very thin for good control of inversion layer thickness and geometry within the transistor conduction channels of the transistors. Since leakage is a function of voltage for a given gate dielectric material and thickness, at low voltages, only a very thin gate dielectric can hold leakage to acceptable levels. These transistors are collectively referred to as logic transistors regardless of the function they may actually perform in the integrated circuit.

However, the low voltages at which the logic transistors operate cannot be reliably communicated outside the confines of the integrated circuit chip due to the longer lengths and larger capacitances of connections to other integrated circuits or peripheral devices. Accordingly, larger transistors operating at higher voltages must also be included in the integrated circuit and are referred to herein as input/output (I/O) transistors although such larger transistors may also be used for such other functions as on-chip voltage regulation and the like. Such larger transistors have linear dimension which are generally increased by 30%-35% relative to the logic transistors; yielding approximately a doubling of footprint and cross-sectional (e.g. conduction channel cross-section) areas. However, these transistors will generally be operated at about 1-2 volts which is significantly higher voltage than the logic transistors; often a factor of 5-10. Accordingly, the breakdown voltage of I/O transistors must be at least on the order of several times the nominal operating voltage of the I/O transistors (e.g. 4V-6V) while the higher operating voltage tends to significantly increase leakage unless a different gate insulator structure is employed in the I/O transistor design.

Leakage can be reduced and breakdown voltage increased to any desired level by providing a sufficiently thick gate dielectric. However, increased thickness of gate dielectric compromises the control of the thickness and geometry of the inversion layer which affects not only switching threshold but other electrical parameters of the transistor such as on/off resistance ratio. For example, consistent with forming I/O transistor gates using processes in common with forming gate dielectrics of logic transistors to the greatest extent possible, a greater gate dielectric thickness could be achieved by simply depositing an additional layer of a conventional gate dielectric material such as silicon oxynitride (SiON) on the gate dielectrics of the I/O transistors while masking the logic transistors using a block-out mask. However, such a resulting structure will cause substantial compromise or criticality of control of inversion layer thickness and geometry (e.g. allowing excessive conduction in the corners of the channel) and such criticality of inversion layer control can only be achieved with great difficulty and potential for compromise of manufacturing yield.

Gate dielectric thickness can be reduced somewhat for a given breakdown voltage and leakage level through use of gate dielectric materials having a particularly high dielectric constant (e.g. greater than about four but potentially as high as about twenty-five) and which are referred to as Hi-K materials. However, Hi-K materials have some significant drawbacks in that they tend to include defects in the as-deposited Hi-K dielectric and can readily be contaminated by other materials that can diffuse into them through the semiconductor structure. Such defects can collect charge and cause changes in switching threshold which are increased with increasing temperature (and, hence, are referred to as bias temperature instabilities or BTI). Such collections of charges that could otherwise function as charge carriers can deplete the carrier population and also locally change the effective electrical field within the conduction channel; collectively having the effect of reducing carrier mobility. For the nominal operating voltages for I/O devices below 100 nm gate length (sub 32 nm technology node), additional Hi-K thickness could be required to meet breakdown voltage requirements for reliable electrically scaled devices.

An additional problem that may be somewhat related to BTI parameters has also been observed in that control over inversion layer thickness and high performance provided by a thin inversion layer has been observed to very slowly degrade over long periods of service under conditions approaching maximum specified clock rates. This degradation of performance is extremely subtle and occurs over very long periods of time and thus the mechanism of this degradation is not well-understood but is believed to be due to thermal effects on oxides and other dielectric materials. However, in practical effect, over hundreds of billions of switching cycles of a transistor under conditions approaching performance and clock rate limits (where thermal and electrical stresses are most severe), a small fraction of a percent of design performance in some combination of on/off resistance ratio, stability of switching threshold, maximum clock rate and the like will be lost. The effect is, in general, only beginning to be observable after several years of operation at near the design limits of the chip. However, it may be of importance in some designs since additional performance may be achieved at the expense of a higher rate of such degradation for integrated circuits intended for extremely high performance in devices likely to become obsolete in a relatively short period of time. Conversely, such an effect can be largely avoided by designing transistors to have performance which is only slightly reduced from the technological limits available when the integrated circuit is designed and thus provide virtually unchanged performance over an extended useful service lifetime of several tens of years.

Returning now to FIGS. 1-8A, manufacture of the invention will now be discussed. Essentially, the invention provides for a gate dielectric structure for I/O transistors 90 that can be formed on or supplemental to the gate dielectric structures formed for the logic transistors 91 on the same chip or wafer. The gate structure in accordance with the invention provides additional gate dielectric thickness sufficient to increase breakdown voltage and reduce leakage at the nominal operating voltages of the I/O transistors while allowing the additional dielectric thickness to be limited to not only allow good control over inversion layer scaling but to remove a large degree of criticality in doing so such that substantial design variation and flexibility is provided.

FIG. 1 illustrates, in a cross-sectional view, a portion of a body 10 of semiconductor material which will become the channel of a transistor. The structure of the remainder of the transistor is unimportant to the practice of the invention and the invention can be applied to and will derive the same meritorious effects in any known or foreseeable transistor design at any current or foreseeable minimum feature size regime and using any semiconductor material such as silicon, germanium, silicon-germanium alloy or the like. The invention is most effective and becomes substantially necessary for I/O transistor designs having a gate length below 100 nm.

It should be understood and will be appreciated by those skilled in the art that the depictions of FIGS. 1-8A are most appropriate to a so-called "gate first" process where the gates of logic and/or I/O transistors are performed prior to other structures of the transistors or other devices included on the integrated circuit chip. However, the illustrations of FIGS. 1-8A would not be significantly altered in a so-called "gate last" process (which, in regard to the invention, can be performed either with or without thermal restrictions as will be discussed in greater detail below) in which the gate structures of the I/O and/or logic transistors are formed subsequent to the formation of other significant structures on the chip or wafer. Therefore, the illustrations of FIGS. 1-8A should be understood as illustrative of both gate first and gate last processes which would only differ by structures within or on the substrate.

Since the invention is a gate insulator structure, the remainder (e.g. the gate electrode and source and drain structures and the structure of logic transistors on the same chip or wafer) of the transistor is not important to the practice of the invention and the remainder of the I/O transistor is schematically illustrated by dashed lines in FIG. 8A. The channel can be any body semiconductor material suitable for formation of a transistor such as a portion of a bulk semiconductor chip or wafer, a portion of the active layer of a semiconductor-on-insulator (SOI) chip or wafer, a deposited layer of semiconductor material in any portion or structure of a semiconductor integrated circuit and the like or even a raised semiconductor channel such as is characteristic of so-called FinFETs, allowing the gate electrode to be formed on two of more sides thereof for improved control of channel conduction.

Thus the direction in which the cross-sectional view of FIGS. 1-8A is taken relative to the conduction direction of the channel is irrelevant to an understanding of the invention sufficient to its practice. The only projected limitation on applicability of the invention is the preferred but partially optional or limited significant thermal processing with which any previously formed structures of the chip or wafer (e.g. in a gate last process) must be compatible in regard to heat budget; a concern that can generally be avoided by forming transistors in accordance with the invention at an early stage of integrated circuit manufacture or limiting/omitting preferred annealing processes as will be described below.

As shown in FIG. 2, the body 10 of semiconductor material or transistor channel is subjected to a non-critical pre-anneal process in a nitrous oxide (N2O) atmosphere to develop a thin layer of a mixture of silicon oxynitride. This thin SiON layer allows passivation of the silicon or germanium content in the channel region and reduces differential ALD SiO2 growth between silicon and germanium containing substrate or other structures. The thickness of the SiON layer 20 is not critical to the practice of the invention but is desirably limited to a very small thickness to avoid compromise of control of inversion layer thickness and geometry in channel 10. This step is preferably common to both the logic transistors and the I/O transistor structure illustrated.

Then, as shown in FIG. 3, a layer 30 of silicon oxide (SiO2) or other oxide of semiconductor material is deposited by atomic layer deposition (ALD). Numerous suitable ALD processes are well-known and produce a layer of deposited material which is very thin and particularly uniform in thickness (e.g, substantially a single atomic thickness, referred to as a monolayer, for each cycle of ALD). This process is repeated a number of times or cycles until a desired thickness is developed. The number of repetitions and final thickness may be varied over a broad range but, as will be discussed in greater detail below, insufficient thickness (e.g. the thickness developed by about thirteen or fewer ALD cycles in n-type transistors or eleven or fewer ALD cycles for p-type transistors at minimum feature sizes of principal interest for the I/O transistors of layer 30 will result in compromise of BTI parameters. This process is also preferably common to both logic and I/O transistors.

Once a sufficient thickness of SiO2 layer 30 is developed, nitridation, preferably from a nitrogen plasma, and, preferably, rapid thermal anneals (RTAs) are performed followed by a furnace anneal, as depicted by arrows 40 in FIG. 4, to implant nitrogen into layer 30 and thus convert the SiO2 (or other semiconductor oxide) layer 30 to SiON (or other semiconductor oxynitride) layer 50 as shown in FIG. 5. This process is also preferably common to both logic and I/O transistors. The thermal budget of these processes can be limited by reduction of temperature and/or time of the annealing processes.

As further illustrated in FIG. 5, the SiON conversion is followed by deposition of a few monolayers (e.g. about three to ten but preferably three to seven monolayers or three to ten (preferably three to seven) ALD cycles) of a Hi-K material such as Hafnium oxide (HfO2). This deposition is illustrated as a discontinuous layer 55 since the Hi-K material tends to nucleate in separate deposits and is not particularly distinguishable, physically, from doping of the surface of the SiON layer 50. This discontinuous layer is sometime referred to as a top-off layer (by analogy to "topping-off" the filling of a volume such as a tank) or, somewhat inaccurately, as an ALD layer (since it is comprised of a plurality of ALD layers) in view of the tendency of such a thin layer to form discontinuous "islands" of Hi-K Material. These terms may be regarded as completely synonymous and interchangeable when used hereinafter. (These apparent effects also suggest that the thicker HfO2 layer 70 which will be discussed below is also discontinuous in nature and will exhibit "island" formation on SiON and annealed SiO2. However, this effect is reduced to a degree by the increased thickness of the top-off HfO2 layer which tends to fill the gaps between the "islands" and thus reduce discontinuities although potentially allowing some defects, as alluded to above, to remain.) The physical nature of the deposit is not known with certainty or fully understood and, in any case, is not important to the practice of the invention other than to provide a controlled concentration or mass of HfO2 at a known distance (e.g. the thickness of layer 30/50) from the channel 10 and within the composite layer of SiON comprising layers 50 and 60 as shown in FIG. 6.

The above process for deposition of layer 50 and deposits 55 is also preferably performed in common for both logic and I/O transistors and layer 50 and deposits 55 subsequently removed from the logic transistors. Alternatively, the logic transistors can be masked with a block-out mask and layer 50 and deposits 55 applied only to the I/O transistor sites.

Layer 60 is then preferably formed by a non-critical (e.g. 600° C.-1200° C. for 15 to 100 seconds) rapid thermal treatment in a sequence of ammonia and oxygen atmospheres.

This process for forming layer 60 is referred to as a RTNH3/RTO process to form an interlayer (IL) dielectric structure and is preferably performed in common for both logic and I/O transistors. A Hi-K material layer 70 is then deposited over the IL layer as shown in FIG. 7. The thickness of Hi-K material layer 70, referred to as a logic device HfO2 gate dielectric, which is critical for setting logic device and reliability targets but can be varied to a degree in accordance with logic transistor design. The thickness of layer 50 and deposits of Hi-K material should, however, have been chosen in view of the desired thickness of layer 70 for the logic transistors so that the volume of Hi-K material in deposits 55 will serve to "top-off" the required volume of Hi-K material in continuous layer 80 in regard to I/O transistors as will be described below. This process is preferably common to both logic and I/O transistors. The thickness produced by twenty-two cycles of ALD Hi-K is preferred to control gate leakage at sub 45 nm gate length without compromising control of inversion layer thickness or significantly altering BTI parameters of either the logic or I/O transistors. Some compromise of transistor performance is marginally observable if more than twenty-six cycles of Hi-K ALD is employed.

This gate dielectric stack formed of layers 20-70 is then optionally but preferably subjected to annealing which, in the logic transistors, intermixes HfO2 layer 70 with the IL deposit 60 and, in the I/O transistors intermixes both monolayer HfO2 deposits 55 and HfO2 layer 70 with the IL deposit 60 to form a continuous layer and providing a thicker HfO2-containing film on the I/O devices than on the logic devices area that achieves an increased breakdown voltage for the I/O devices. This annealing process is preferably performed for 120 to 300 seconds at 600° C. to 800° C. or higher but the thermal budget of this annealing process may also be limited by limiting temperature and/or duration or omitted altogether although limitation or omission of annealing is not preferred, as will be discussed in greater detail below. Deposition and RTNH3/RTO processing of interlayer 60, deposition of Hi-K layer 70 are preferably applied to both the logic transistors and I/O transistors in common. Of course, annealing, if performed must necessarily be applied to the entire chip or wafer and all structures that have been formed therein or thereon.

Figure 8B:
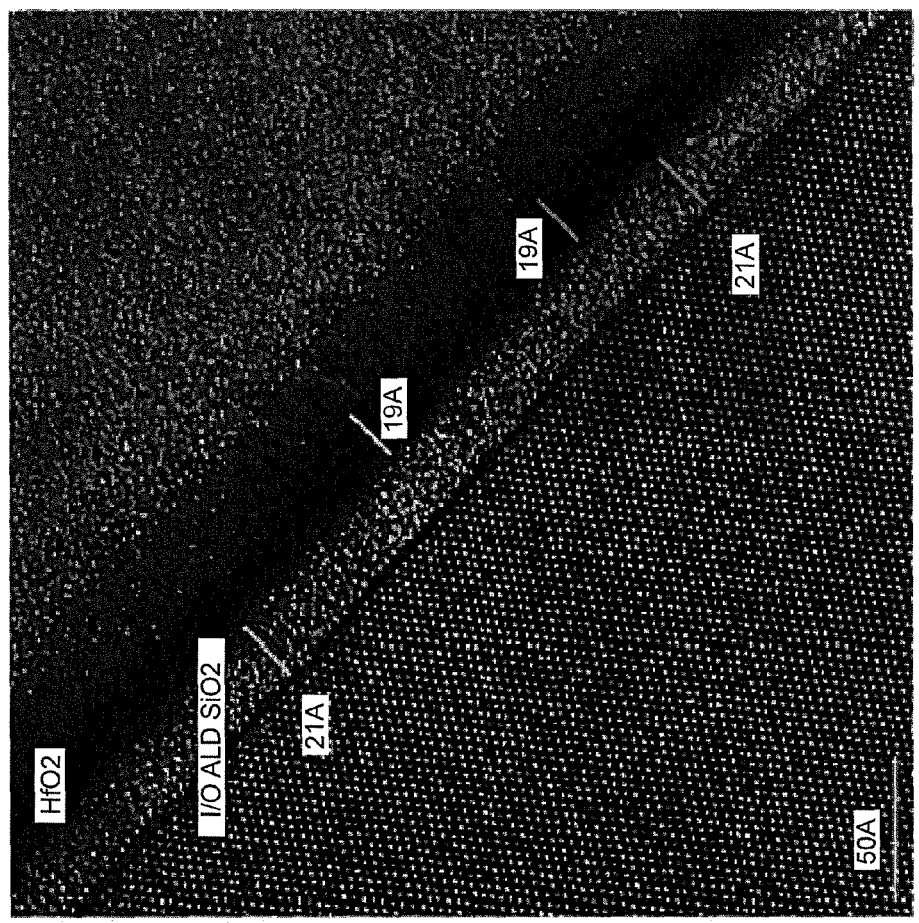
FIG. 8B is a scanning electron microscope image of a cross-section of the gate structure of the invention corresponding to FIG. 8A, and FIG. 9 graphically illustrates how variation of the processes depicted in FIGS. 1-8 allows for independent control of breakdown voltage and inversion layer scaling for an n-type FET.

FIG. 8B is a tunneling electron microscope (TEM) image of the cross-section of the resulting structure, for comparison with FIG. 8A. It should be noted from FIG. 8B that, if the annealing is performed for the preferred time and temperature, the logic device dielectric $HfO_2$ 70, IL deposit 60 and monolayer top-off of Hi-K material deposits are not observable as separate layers or separate deposits; indicating a substantially homogeneous intermixing of these separately deposited materials. The thickness of composite layer 80 is increased from the gate dielectric 70 in logic areas due to the additional $HfO_2$ from monolayer/top-off deposits 55. This allows dielectric breakdown voltage of I/O devices to be higher consistent with a scaled inversion layer. Composite layer 80 is highly uniform in thickness and only slight irregularity in thickness of SiON layer 30 is observed. Accordingly, full annealing is preferred although it is projected that a degree of the meritorious effects of the invention can be achieved even if annealing is limited or omitted since it appears that the amount of Hi-K material at a controlled distance (e.g. the thickness of layer 30) from or integrated to some degree with the IL deposit is the controlling parameter for successful practice of the invention.

In this regard, it should also be appreciated that the amount of Hi-K material in deposits 55 is a small but highly variable fraction of the Hi-K material available from layer 70 and, once layer 80 is fully formed, layers 60 70 is fully nucleated with layer 55 forming a single gate dielectric layer in the I/O device region. Additionally, it has been found that layer 80 will have a graded concentration of nitrogen diffused from layer 60. Therefore, since the number of layers in the gate dielectric structure is reduced by annealing, if performed, the resulting structure may be accurately referred to as a graded Hi-K pseudo-stack. If annealing is not performed or is limited in thermal budget below the preferred annealing parameters, the layer 70 and layer 55 in the I/O transistors remains substantially as-deposited or fully intermixed (possibly with a lesser degree of homogeneity), respectively, but still exhibit substantially increased breakdown voltage. That is, possibly due to the tendency of Hi-K materials to nucleate, even short annealing at reduced temperatures or even the thermal budget of the number of cycles of ALD Hi-K deposition to form continuous Hi-K layer 70 will achieve intermixing of the HfO2 materials and the IL materials to form continuous layer 80 in both the logic and I/O transistors although slight reduction in consistency of electrical performance and uniformity of electrical properties may be expected due to a somewhat reduced degree of intermixing of materials. However, it has also been observed that some reduction in problems associated with Hi-K materials, as alluded to above, is achieved even when annealing is omitted altogether, while the Hi-K material serves to provide adequate breakdown voltage at thickness which are effective to provide scaling of the inversion layer without increasing BTI parameters of either the logic transistors or the I/O transistors.

Figure 9:
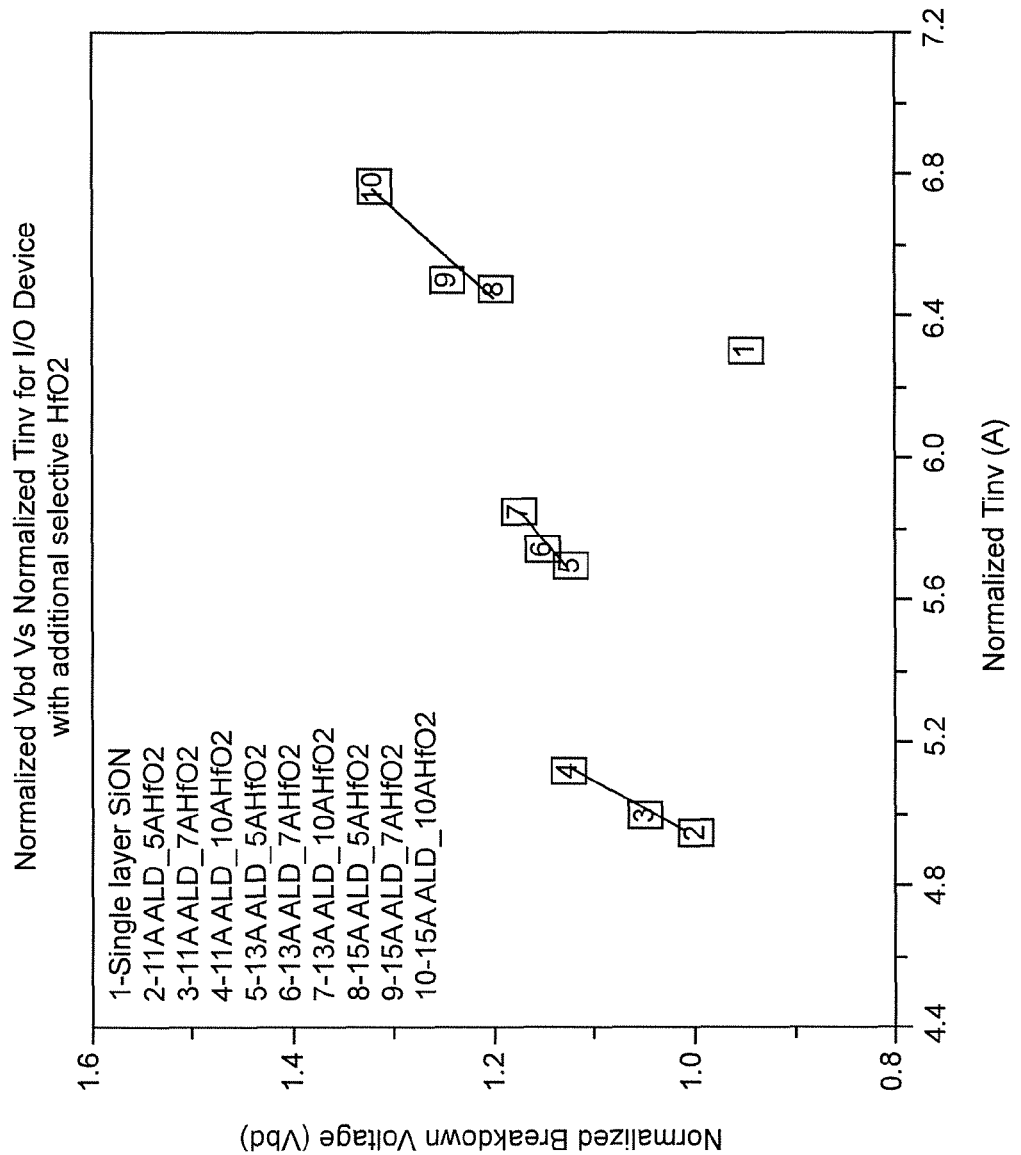

Referring now to FIG. 9, the effects of the invention as observed for an n-type Field effect transistor (FET) will now be discussed. It should be noted for FIG. 9, data is provided for each of a plurality of gate structures formed in accordance with the process described above with reference to FIGS. 1-8A but with different numbers of cycles of ALD (and thus different thicknesses) of layers 30/50 and layers 60 and 70 (including Hi-K material deposits 55) and a control transistor having a single SiON layer, for comparison. Specifically, transistors indicated by numeral "1" represent data for control transistors while groups of transistors 2-4, 5-7 and 8-10 in FIG. 9 have different respective thicknesses (or number of ALD cycles) of SiON layer 30/50 and within each group, there is a progression of three respective thicknesses (or numbers of ALD cycles) of Hi-K material deposition/doping 55, as illustrated in FIG. 5, discussed above. Further, it should be noted that the scales of the axes of FIG. 9 are normalized since values vary with different minimum feature size regimes. However, breakdown voltage improvements consistent with scaling of the inversion layer are clearly demonstrated.

Specifically, FIG. 9 illustrates breakdown voltage as a function of normalized inversion layer thickness (in Angstroms) for a control transistor structure and embodiments of transistors in accordance with the invention. It can be readily seen that all of the transistors in accordance with the invention have an increased breakdown voltage compared with the control transistor structure. The inversion layer thickness, tiny, is approximately the same as or less than that of the control transistor structure. It can also be seen that the data fall into three groups exhibiting similar trends: increasing breakdown voltage for each group with increasing thickness or number of cycles of ALD SiO2 deposition 30 (e.g. 11, 13 and 15 cycles, respectively, which determines the thickness of SiON layer 50) and also increasing breakdown voltage with thickness or number of ALD HfOx producing depositions 55. The trends in each group are indicated by lines indicating the "best fit" of the line through each group. It can also be observed that the groups are comparably spaced both vertically and horizontally and would appear to form a relatively broad diagonal band upon inclusion of intervening numbers of cycles of ALD deposition in layer 30/50 and depositions 55; indicating a broad range of combinations of values of tiny and Vbd that can be chosen by a designer for transistors for particular applications. However, in practice, the extent of this band may be limited by BTI parameters and required transistor performance for critical applications. Maximum and minimum numbers of ALD cycles for each of layers 30/50, 55 and 70 for advantageous application of the invention without significant compromises of BTI parameters of transistor performance have been indicated above.

The number of cycles of Hi-K material deposition should be as small as possible to provide the breakdown voltage required above the nominal operating voltage of the transistor. Nevertheless, as shown in FIG. 9, a substantial increase in breakdown voltage can be achieved in accordance with the invention consistent with maintaining the dimensions and geometry of the inversion layer controlled by the gate electrode and allowing the inversion layer of, for example, I/O transistors to be scaled to be well-matched with the threshold voltage and nominal voltage swing of the logic transistors of a given integrated circuit. Further, as with the n-type FET data illustrated in FIG. 9, embodiments of the invention with intervening numbers of cycles of ALD forming layer 30/50 would provide a substantial continuum of possible inversion layer thicknesses while allowing substantial flexibility of the breakdown voltage and leakage reduction that can be provided which, in turn, provides design flexibility regarding the trade-off between performance and useful lifetime without significant change in transistor electrical characteristics due to thermal effects on oxides and other dielectric materials.

In view of the foregoing, it is readily seen that the invention provides an improved gate dielectric structure having increased breakdown voltage and reduced leakage required for I/O transistors which allows substantial design flexibility and scaling of the I/O transistor inversion layer while utilizing the gate structure and manufacturing process used for logic transistors on the same chip with only the addition of deposition of Hi-K material 55 and top-off layer 70. The structure in accordance with the invention also substantially avoids problems of carrier mobility and the like associated with lattice defects in Hi-K materials. Further, while the preferred embodiment of the invention maximizes the number of processes performed in common for the logic transistors and the I/O transistors (e.g. differing only in the removal or avoidance of deposition of Hi-K deposits 55 for the logic transistors) while providing a structure for logic transistors of high quality and performance, the invention may be practiced in a manner which is partially or fully decoupled from the logic transistor formation through use of block-out masks of low criticality. For example, as alluded to above, Hi-K materials can be omitted from the logic transistors or entirely different gate stack or insulator structure designs can be employed for the logic transistors, as may be selected by the integrated circuit designer. The transistor structure having increased breakdown voltage while allowing control of inversion layer thickness can also be employed for discrete transistors and/or integrated circuits having transistors of only a single design.

While the invention has been described in terms of a single preferred embodiment, those skilled in the art will recognize that the invention can be practiced with modification within the spirit and scope of the appended claims.

We claim:

1. A field effect transistor including
a gate dielectric stack interposed between a gate electrode and a semiconductor conduction channel, said gate dielectric stack comprising
a layer of oxide material, and
a composite layer of a volume of interlayer material intermixed with a volume of Hi-K material wherein said volume of Hi-K material is comprised of respective volumes of two layers of Hi-K material, said respective volumes of Hi-K material being formed from predetermined numbers of ALD layers of Hi-K material in respective layers of said two layers of Hi-K material, and
wherein said composite layer has a graded concentration of nitrogen diffused from said volume of interlayer material between said two layers of Hi-K material.

2. A field effect transistor as recited in claim 1 wherein Hi-K material in said composite layer is formed from a volume of Hi-K material deposited by a number of ALD cycles of Hi-K material in a first layer and a number of ALD Hi-K cycles in a second layer, said first layer and said second layer being separated by said interlayer material.

3. A field effect transistor as recited in claim 2 wherein said number of cycles of ALD Hi-K in said first layer is in a range of five to ten and said number of cycles of ALD Hi-K in said second layer is in a range of twenty-two to twenty-six.

4. A field effect transistor as recited in claim 1 wherein said layer of oxide material comprises a number of monolayers of ALD silicon oxide and nitrogen wherein said number of monolayers is in a range of eleven to fifteen.

5. A field effect transistor as recited in claim 1 wherein said composite layer comprises a substantially homogeneous mixture of interlayer material and Hi-K material.

6. A field effect transistor as recited in claim 1 further including
a passivation layer interposed between said conduction channel and said layer of oxide material.

7. A field effect transistor as recited in claim 1, wherein said conduction channel includes germanium or silicon.

8. An integrated circuit comprising
a plurality of logic transistors, and
a plurality of I/O transistors, wherein at least one said I/O transistor includes a gate dielectric stack interposed between a gate electrode and a conduction channel, said gate dielectric stack comprising
a layer of oxide material, and
a composite layer of a volume of interlayer material and a volume of Hi-K material wherein said volume of Hi-K material in a logic transistor is comprised of a volume of a layer of Hi-K material and said volume of Hi-K material in an I/O transistor is comprised of respective volumes of two layers of Hi-K material, and
wherein said composite layer has a graded concentration of nitrogen diffused from said volume of interlayer material between said two layers of Hi-K material.

9. An integrated circuit as recited in claim 8 wherein Hi-K material in said composite layer is formed from a volume of Hi-K material deposited by first a number of ALD cycles of Hi-K material in a first layer and a second number of ALD cycles of Hi-K material in a second layer, said first layer and said second layer being separated by the interlayer material.

10. An integrated circuit as recited in claim 9, wherein said plurality of logic transistors include a composite layer comprising a substantially homogeneous mixture of Hi-K material and interlayer material and wherein a volume of Hi-K material in said composite layer of said plurality of I/O transistors exceeds a volume of Hi-K material in said composite layer of said logic transistors by an amount of Hi-K material in said first layer of composite material.

11. An integrated circuit as recited in claim 9 wherein said first number of cycles of ALD Hi-K in said first layer is in a range of five to ten and said second number of cycles of ALD Hi-K in said second layer is in the range of twenty-two to twenty-six.

12. An integrated circuit as recited in claim 8 wherein said composite layer comprises a substantially homogeneous mixture of the interlayer material and Hi-K material.

13. An integrated circuit as recited in claim 8 further including
a passivation layer interposed between said conduction channel and said layer of oxide material.

14. An integrated circuit as recited in claim 8 wherein said layer of oxide material is a volume of oxynitride material deposited by a number of cycles of ALD silicon oxide and nitrogen wherein said number of cycles is in the range of eleven to fifteen.

15. An integrated circuit as recited in claim 8, wherein said conduction channel includes germanium or silicon.

16. A method of manufacture of an integrated circuit comprising logic transistors and I/O transistors, said method comprising steps of
forming an oxynitride layer at an I/O transistor location and a logic transistor location,
forming a layer of Hi-K material at said I/O transistor location,
forming an interlayer dielectric layer at said I/O transistor location and at logic transistor locations,
depositing a layer of Hi-K material on said interlayer dielectric layer, and
causing intermixing of said Hi-K material and material of said interlayer dielectric layer,
whereby volume of Hi-K at said I/O transistor locations differs from volume of Hi-K material at said logic transistor locations.

17. A method as recited in claim 16 including the further step of
removing said Hi-K material from sites of logic transistors prior to said step of forming said interlayer dielectric layer.

18. A method as recited in claim 17 including a further step of
annealing said Hi-K material and said interlayer dielectric layer to cause intermixing of said Hi-K material layer and said interlayer dielectric layer.

19. A method as recited in claim 16 including a further step of
annealing said Hi-K material and said interlayer dielectric layer to cause intermixing of said Hi-K material and said interlayer dielectric layer.

20. A method as recited in claim 16, including a further step of
forming a passivation layer on semiconductor material at a location of a transistor channel prior to said step of forming an oxynitride layer.

* * * * *